United States Patent
Ko et al.

(10) Patent No.: US 11,094,600 B2
(45) Date of Patent: Aug. 17, 2021

(54) METHOD OF PREDICTING WARPAGE OF SILICON WAFER AND METHOD OF PRODUCING SILICON WAFER

(71) Applicant: SUMCO CORPORATION, Tokyo (JP)

(72) Inventors: Bong-Gyun Ko, Tokyo (JP); Kousuke Takata, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/970,063

(22) PCT Filed: May 21, 2018

(86) PCT No.: PCT/JP2018/019432
§ 371 (c)(1),
(2) Date: Aug. 14, 2020

(87) PCT Pub. No.: WO2019/167294
PCT Pub. Date: Sep. 6, 2019

(65) Prior Publication Data
US 2020/0411392 A1 Dec. 31, 2020

(30) Foreign Application Priority Data
Feb. 27, 2018 (JP) .............................. JP2018-033400

(51) Int. Cl.
*H01L 21/66* (2006.01)
*H01L 21/324* (2006.01)

(52) U.S. Cl.
CPC ............ *H01L 22/20* (2013.01); *H01L 21/324* (2013.01)

(58) Field of Classification Search
None
See application file for complete search history.

(56) References Cited

U.S. PATENT DOCUMENTS

| | | | |
|---|---|---|---|
| 2016/0247694 A1 | 8/2016 | Fujise et al. | |
| 2016/0377554 A1 | 12/2016 | Fujise et al. | |
| 2020/0411392 A1* | 12/2020 | Ko | H01L 21/00 |

FOREIGN PATENT DOCUMENTS

| | | |
|---|---|---|
| JP | 2009-164155 A | 7/2009 |
| JP | 2010-45247 A | 2/2010 |

(Continued)

OTHER PUBLICATIONS

ISR for PCT/JP2018/019432, dated Aug. 7, 2018.
(Continued)

*Primary Examiner* — Jack S Chen
(74) *Attorney, Agent, or Firm* — Greenblum & Bernstein, P.L.C.

(57) ABSTRACT

Provided is a method capable of predicting the warpage caused when a silicon wafer is subjected to heat treatment taking into account the effect of oxygen and a method of producing a silicon wafer. The method includes: determining the mobile dislocation density, the stress, and the time evolution of the strain of the silicon wafer being subjected to heat treatment from the rate of change in the strain and the rate of change in the mobile dislocation density; and determining the magnitude of plastic deformation of the silicon wafer as a warpage. The mobile dislocation density $N_i$ at the start of the heat treatment is given as:

$$N_i = A \times (\Delta O_i \times L - L_o)^{2.5} \quad (1),$$

where A and $L_o$: constants, $\Delta O_i$: the concentration of oxygen used by oxygen precipitates in the silicon wafer at the start of the heat treatment, L: the mean size of the oxygen precipitates at the start of the heat treatment.

15 Claims, 2 Drawing Sheets

(56) References Cited

FOREIGN PATENT DOCUMENTS

| JP | 2016-157865 A | 9/2016 |
| JP | 2017-17065 A | 1/2017 |
| JP | 2017-152436 A | 8/2017 |
| TW | 200818327 A | 4/2008 |

OTHER PUBLICATIONS

IPRP for PCT/JP2018/019432, dated Aug. 27, 2020 (w/ translation).
Office Action issued in TW App. No. 107109432, dated Nov. 9, 2018 (w/ translation).
Owen, D., "Stress Inspection for Overlay Characterization", Proceedings of the SPIE, vol. 8681, id. 86812T 7, 2013, pp. 1-7.
Suezawa, M. et al., "Dislocation Dynamics in the Plastic Deformation of Silicon Crystals", Phys. Stat. Sol. (a)51, 1979, pp. 217-226.
Haasen, P., "Zur plastischen Verformung von Germanium und InSb", Zeit. Phys. 167, Feb. 5, 1962, pp. 461-467, (w/ Eng. Abstract; discussed on p. 96 of cite No. C07; discussed in paragraph [0005] of specification).
Alexander et al. "Dislocations and Plastic Flow in the Diamond Structure", Editors: Frederick Seitz, David Turnbull, Henry Ehrenreich, Solid State Physics, Academic Press, vol. 22, 1969, pp. 27-158, ISSN 0081-1947, ISBN 9780126077223.
Miyazaki, N., "Dislocation Density Evaluation Using Dislocation Kinetics Model", Journal of Crystal Growth, vol. 303, 2007, pp. 302-309.
Nakano, S. et al., "Numerical analysis of the relation between dislocation density and residual strain in silicon ingots used in solar cells", Journal of Crystal Growth, vol. 474, 2017, pp. 130-134.

\* cited by examiner

METHOD OF PREDICTING WARPAGE OF SILICON WAFER AND METHOD OF PRODUCING SILICON WAFER

TECHNICAL FIELD

This disclosure relates to a method of predicting warpage of a silicon wafer and a method of producing a silicon wafer.

BACKGROUND

A semiconductor device production process using a silicon wafer includes various heat treatment procedures, and stresses created during such procedures would cause the formation of dislocations, thus plastic deformation would occur. The formation and the development of dislocations in a silicon wafer in a semiconductor device production process are severe problems leading to reduction in the performance and yield of the device.

In particular, for recent advanced logic or memory devices, high stress is applied to a silicon wafer not only due to more rapid temperature changes caused by high temperature short-time annealing processes such as laser spike annealing (LSA) and flash lamp annealing (FLA) than in conventional heat treatments but also in terms of device structures due to the use of FinFETs or three-dimensional structures. Accordingly, slips are formed due to the formation and development of dislocations in a silicon wafer, which results in warpage of the silicon wafer; thus, overlay failure is caused and the yield is reduced (for example, see David M. Owen, Proceedings of the SPIE, Volume 8681, id. 86812T 7 pp. (2013) (NPL 1)).

Predicting plastic deformation with such dislocations, that is, the warpage of a wafer is one of important challenges in improving the performance and the yield of a semiconductor device. However, it is very challenging that stress calculation includes the plastic deformation which occurs beyond an elastic regime. In particular, to establish a physically appropriate plastic deformation model, a wide range of phenomena from the dislocation motion at the atomic level to deformations at the wafer level are required to be understood.

Methods of predicting the magnitude of plastic deformation of crystal include the Haasen-Alexander-Sumino model (hereinafter referred to as "HAS model") in which the magnitude of plastic deformation of crystal is calculated by quantitatively estimating the propagation of dislocations, calculating the dislocation density, and associating the magnitude of strain due to slips with the change in the magnitude of plastic deformation with time (for example, see P. Haasen, Zeit. Phys. 167 (1962) 461 (NPL 2) and M. Suezawa, K. Sumino, I. Yonenaga, Phys. Stat. Solidi A51 (1979) 217 (NPL 3)).

CITATION LIST

Non-Patent Literature

NPL 1: David M. Owen, Proceedings of the SPIE, Volume 8681, id. 86812T 7 pp. (2013)
NPL 2: P. Haasen, Zeit. Phys. 167 (1962) 461.
NPL 3: M. Suezawa, K. Sumino, I. Yonenaga, Phys. Stat. Solidi A51 (1979) 217

SUMMARY

Technical Problem

However, plastic behavior typified by warpage of a silicon wafer is well known to depend on oxygen concentration, oxygen precipitate density, etc. Accordingly, in order to appropriately apply the HAS model to a process for a silicon wafer, the initial dislocation density given by the HAS model is required to be suitably determined to meet the conditions for the wafer.

It could therefore be helpful to provide a method capable of predicting the warpage caused when a silicon wafer is subjected to heat treatment taking into account the effect of oxygen and a method of producing a silicon wafer.

Solution to Problem

We propose the following features to address the above challenges.

[1] A method of predicting warpage caused when a silicon wafer is subjected to heat treatment, comprising:

determining a mobile dislocation density, a stress, and a time evolution of strain of the silicon wafer being subjected to heat treatment from a rate of change in the strain and a rate of change in the mobile dislocation density; and determining a magnitude of plastic deformation of the silicon wafer as a warpage based on the determined time evolution of the strain, wherein a mobile dislocation density $N_i$ at the start of the heat treatment is given as:

$$N_i = A \times (\Delta O_i \times L - L_o)^{2.5} \quad (1),$$

where A and $L_0$: constants, $\Delta O_i$: a concentration of oxygen used by oxygen precipitates in the silicon wafer at the start of the heat treatment, L: a mean size of the oxygen precipitates in the silicon wafer at the start of the heat treatment.

[2] The method of predicting warpage of a silicon wafer, according to [1] above, wherein the rate of change $d\varepsilon/dt$ in the strain $\varepsilon$ is given as:

$$\frac{d\varepsilon_{ij}^p}{dt} = \sum_{n=1}^{12} f^{(n)} p_{ij}^{(n)}, \quad (2)$$

where $$f^{(n)} = bk_0 N_m^{(n)} (\tau_{eff}^{(n)})^p \exp\left(\frac{-Q}{kT}\right), \quad (3)$$

$$P_{ij}^{(n)} = \frac{1}{2}\left(\frac{\sigma_{RS}^{(n)}}{|\sigma_{RS}^{(n)}|}\right)(v_i^{(n)} b_j^{(n)} + v_j^{(n)} b_i^{(n)}), \quad (4)$$

$$\tau_{eff}^{(n)} = |\sigma_{RS}^{(n)}| - D\sqrt{N_m^{(n)}} - \tau_d, \quad (5)$$

and b: a magnitude of a Burgers vector, $k_0$ and p: material constants, $N_m$: the mobile dislocation density, $\tau_{eff}$: an effective shear stress, Q: a Peierls potential of silicon, k: the Boltzmann constant, T: a temperature, $\sigma_{RS}$: the stress, $v_i$: a unit vector in the normal direction of a slip plane, $b_i$: a unit vector parallel with a slip direction, D: a strain hardening factor, and $\tau_d$: a drag stress.

[3] The method of predicting warpage of a silicon wafer, according to [1] or [2] above, wherein the rate of change $dN_m^{(n)}/dt$ in the mobile dislocation density $N_m$ is given as:

$$\frac{dN_m^{(n)}}{dt} = Kk_0 N_m^{(n)} \left(\exp\left(\frac{-Q}{kT}\right)\right)(\tau_{eff}^{(n)})^{p+\lambda}, \quad (6)$$

-continued $$\tau_{\mathit{eff}}^{(n)} = |\sigma_{RS}^{(n)}| - D\sqrt{N_m^{(n)}} - \tau_d, \quad (7)$$

and

K: a constant, $k_0$, p, and $\lambda$: material constants, Q: the Peierls potential of silicon, k: the Boltzmann constant, T: the temperature, $\tau_{\mathit{eff}}$: the effective shear stress, $\sigma_{RS}$: the stress, D: the strain hardening factor, and $\tau_d$: the drag stress.

[4] The method of predicting warpage of a silicon wafer, according to [2] or [3] above, wherein as the Peierls potential Q of silicon, a Peierls potential of silicon, determined in consideration of the effect of impurities is used.

[5] The method of predicting warpage of a silicon wafer, according to any one of [1] to [4] above, wherein the stress is determined by the finite element method.

[6] A method of producing a silicon wafer, comprising:
using $\Delta O_i$ and L as parameters, determining $\Delta O_i$ and L with which warpage of the silicon wafer after the heat treatment is equal to or less than a target warpage, by the method according to any one of [1] to [5] above;
determining conditions for growing a silicon single crystal such that $\Delta O_i$ and L of the silicon wafer at the start of the heat treatment become $\Delta O_i$ and L with which the warpage of the silicon wafer after the heat treatment is equal to or less than the target warpage, thereby growing the silicon single crystal; and
obtaining silicon wafers by working the resultant silicon single crystal.

Advantageous Effect

According to this disclosure, the warpage caused when a silicon wafer is subjected to heat treatment can be predicted in consideration of the effect of oxygen.

BRIEF DESCRIPTION OF THE DRAWINGS

In the accompanying drawings.

Figure 1:
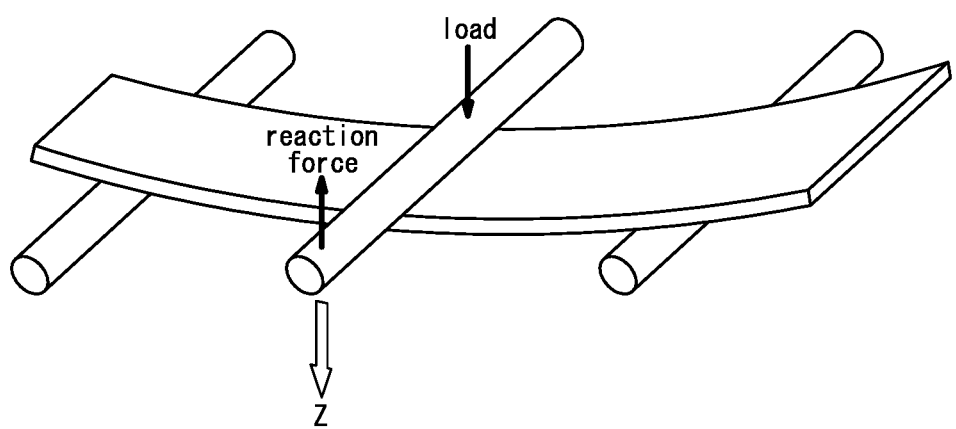
FIG. 1 is a diagram illustrating the finite element method model for a three-point bending test.

DETAILED DESCRIPTION (Method of Predicting Warpage of Silicon Wafer)
Embodiments of this disclosure will now be described with reference to the drawings. A method of predicting warpage of a silicon wafer is a method of predicting the warpage caused when the silicon wafer is subjected to heat treatment. Here, the mobile dislocation density, the stress, and the time evolution of strain of the silicon wafer being subjected to heat treatment are determined from the rate of change in the strain and the rate of change in the mobile dislocation density; and the magnitude of plastic deformation of the silicon wafer is determined as a warpage based on the determined time evolution of the strain, At this point, the mobile dislocation density $N_i$ at the start of the heat treatment is given as:

$$N_i = A \times (\Delta O_i \times L - L_o)^{2.5} \quad (8),$$

where A and $L_0$: constants, $\Delta O_i$ ($1 \times 10^{17}/cm^3$): the concentration ($1/cm^3$) of oxygen used by oxygen precipitates at the start of the heat treatment, and L: the mean size (nm) of the oxygen precipitates in the silicon wafer at the start of the heat treatment.

As described above, plastic behavior of a silicon wafer is well known to depend on oxygen concentration, oxygen precipitate density, etc. Accordingly, in order to appropriately apply the HAS model to a silicon wafer process, the initial dislocation density given by the HAS model is required to be suitably determined to meet the conditions for the wafer.

In view of the above, with a view to applying the HAS model to a heat treatment process for a silicon wafer, the inventors of this disclosure first studied the relationship between the initial dislocation density and oxygen. As result, they found that there is the relationship given by Equation (8) above. An experiment and simulation that led to Equation (8) above will now be described.

In order to perform simulation of plastic deformation, the mobile dislocation density in a silicon wafer at the start of heat treatment (initial dislocation density) is required to be given. With this mind, they performed an experiment and simulation to determine the correlation between the conditions for oxygen precipitation heat treatment (for example, BMD forming heat treatment) and the mobile dislocation density.

First, in the experiment, CZ silicon wafers with a diameter of 300 mm, having an initial oxygen concentration $O_i$ of approximately $1.3 \times 10^{18}$ cm$^{-3}$ was prepared, and heat treatment was performed at 650° C. to 850° C. for 4 h to 20 h, followed by heat treatment at 1000° C. for 0 h to 8 h. Thus, samples having bulk micro defects (BMDs) that were oxygen precipitates having a density of $2.2 \times 10^9$ cm$^{-3}$ to $1.2 \times 10^{10}$ cm$^{-3}$, a mean size L of 210 nm to 350 nm were prepared under 8 sets of conditions. The thus obtained sample under each set of conditions was subjected to three-point bending tests under three temperature conditions of 650° C., 750° C., and 850° C., thus 24 stress-strain curves were obtained.

Next, in the simulation, a finite element method model for the three-point bending test as illustrated in FIG. 1 was created, and a plastic deformation model was applied to various initial dislocation densities to perform calculation. Further, for each sample, the initial dislocation density with which the stress-strain curve obtained by the calculation agrees most with the one obtained in the experiments was determined.

With a view to obtaining a correlation between the initial dislocation density obtained as described above and the oxygen precipitates, various studies were made using the density and mean size of BMDs as parameters. As a result, the initial dislocation density $N_i$ was found to have the strongest correlation with the product of the concentration $\Delta O_i$ of oxygen used in the formation of BMDs (that is, the difference between the initial oxygen concentration $O_i$ before BMD forming heat treatment and the residual oxygen concentration $O_f$ after the BMD forming heat treatment) and the mean size L of the BMDs.

Figure 2:
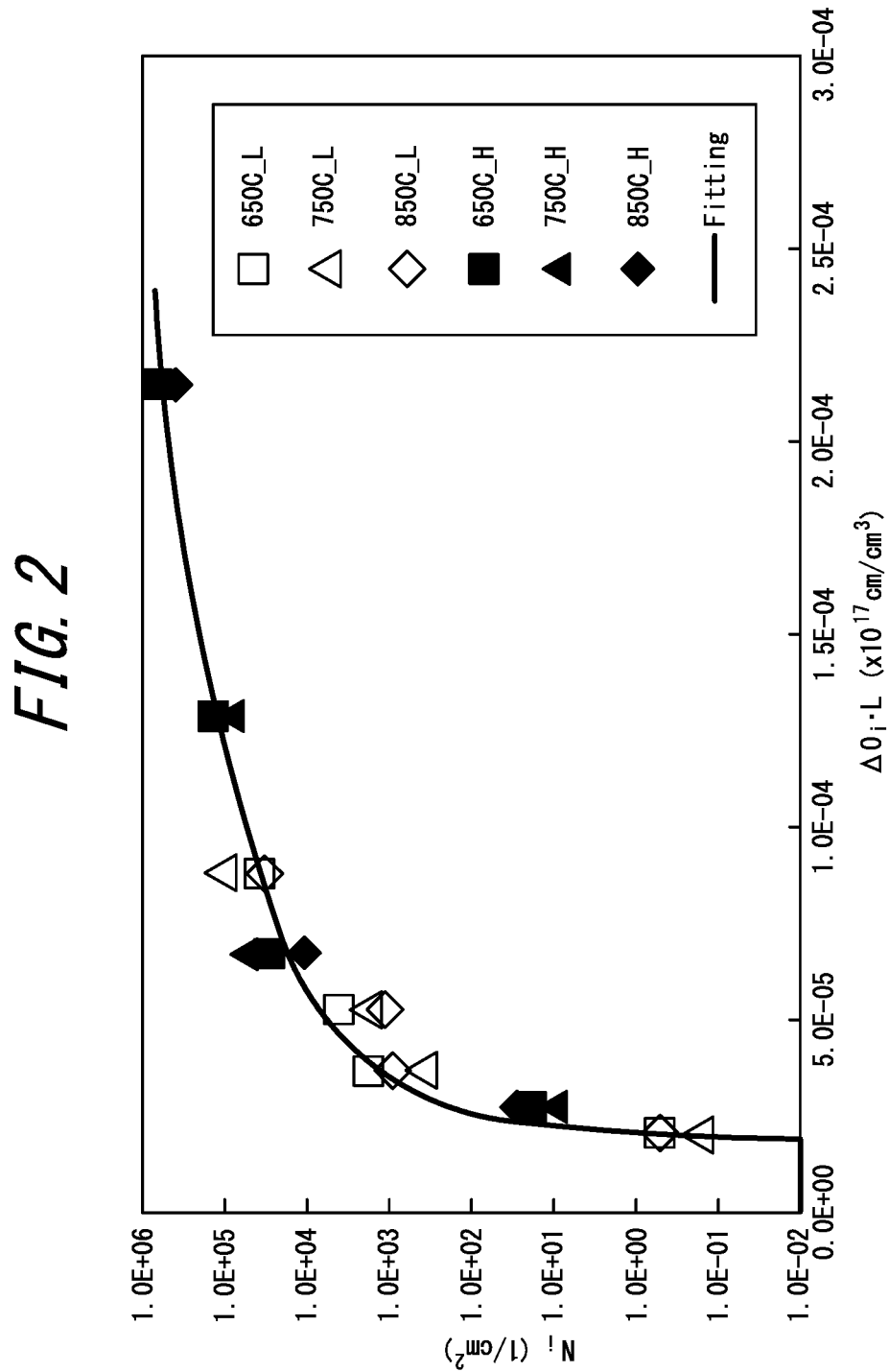
FIG. 2 is a diagram illustrating the relationship between the product of the concentration of oxygen used for the formation of oxygen precipitates at the start of heat treatment and the mean size of the oxygen precipitates, and the initial dislocation density.

FIG. 2 illustrates the relation of the initial dislocation density to the product of $\Delta O_i$ and L. The inventors diligently studied to find a relational expression that has the best fit with the plot given in FIG. 2. As a result, Equation (8) above was found as the relational expression. The value of $\Delta O_i$ in Equation (8) is obtained by dividing the actual concentration by $1.0 \times 10^{17}$ cm$^{-3}$, and when $\Delta O_i$ is replaced with a with no unit, $\alpha L$ can be interpreted as the "effective oxygen precipitate size" taking into account the amount of the precipitates.

Further, $L_0$ being 200 nm means that oxygen precipitates having a size of 200 nm or less have little initial dislocation density, thus at least the existence of the mobile dislocation density can be denied. This result agrees with the result in a report by Sueoka et al (see K. Sueoka, M. Akatsuka et al., J. J. Appl. Phys. 36(1997)) describing that oxygen precipitates having a size of 200 nm or less do not promote the formation of slips.

Thus, the initial dislocation density $N_i$ at the start of heat treatment was determined. When the initial dislocation density $N_i$ is given, the warpage of a silicon wafer can be predicted based on the HAS model. Here, an equation for calculating the warpage of a silicon wafer is described.

When dislocations move in silicon crystal, since the dislocations move in the direction on (111) plane, the dislocations are determined to crystallographically have 12 slip systems. Based on such a crystal plasticity theory, the HAS model, which is a plastic deformation calculation model, can be extended to meet a multiaxial stress state so as to be applied to simulation calculations (for example, three-dimensional finite element calculation method)(for example, see N. Miyazaki, M. Sakaguchi, Trans. JSME Ser. A65 (2002)21).

The rate of change (increase rate) $d\varepsilon/dt$ in the plastic strain $\varepsilon$ can be expressed by Equation (9) considering the slip directions in the silicon crystal.

$$\frac{d\varepsilon_{ij}^p}{dt} = \sum_{n=1}^{12} f^{(n)} p_{ij}^{(n)}, \tag{9}$$

where i and j represent crystallographic axes, and n represents the nth slip system of the 12 slip systems. Here, $f^{(n)}$ and $p_{ij}^{(n)}$ on the right-hand side of Equation (9) above can be expressed by Equation (10) and Equation (11) below.

$$f^{(n)} = bk_0 N_m^{(n)} (\tau_{eff}^{(n)})^p \exp\left(\frac{-Q}{kT}\right), \tag{10}$$

where b is the magnitude of the Burgers vector, $k_0$ and p are the material constants (around 1.0), $N_m^{(n)}$ is the mobile dislocation density of the nth slip system, $\tau_{eff}^{(n)}$ is the effective shear stress on the nth slip system, Q is the Peierls potential of silicon, k is the Boltzmann constant, and T is the temperature.

$$p_{ij}^{(n)} = \frac{1}{2}\left(\frac{\sigma_{RS}^{(n)}}{|\sigma_{RS}^{(n)}|}\right)(v_i^{(n)} b_j^{(n)} + v_j^{(n)} b_i^{(n)}), \tag{11}$$

where $\sigma_{RS}^{(n)}$ is the shear stress resolved on the nth slip system, $v_i^{(n)}$ is a unit vector in the normal direction of the slip plane of the nth slip system, and $b_i$ is a unit vector parallel with the slip direction of the nth slip system. This is required to calculate the Schmid factor. Further, the rate of change (increase rate) in the mobile dislocation density $N_m^{(n)}$ can be expressed by Equation (12) below.

$$\frac{dN_m^{(n)}}{dt} = K k_0 N_m^{(n)} \left(\exp\left(\frac{-Q}{kT}\right)\right)(\tau_{eff}^{(n)})^{p+\lambda}, \tag{12}$$

where K is a proportional constant determined according to the correspondence with the experimental results, and $\lambda$ is the material constant. Further, the effective shear stress $\tau_{eff}^{(n)}$ is the stress resolved in the direction of each slip, and is expressed by Equation (13) below.

$$\tau_{eff}^{(n)} = |\sigma_{RS}^{(n)}| - D\sqrt{N_m^{(n)}} - \tau_d \tag{13},$$

where D is the strain hardening factor: $Gb/\beta$. Further, $\tau_d$ is the drag stress caused due to the interaction between the dislocations and impurities.

Based on Equations (8) to (13) above, the warpage caused when the silicon wafer is subjected to heat treatment can be determined. A procedure for calculating the warpage will now be described in detail.

First, in Step S1, the initial dislocation density $N_i$ at the start of the heat treatment (t=0) in which slips occur is determined using Equation (8). The initial dislocation density $N_i$ can be found separately by giving the concentration $\Delta O_i$ of oxygen used in the formation of the oxygen precipitates in the heat treatment and the mean size L of the oxygen precipitates. For example, when the silicon wafer is subjected to an experiment or simulation for heat treatment in which BMDs are formed in advance, and $\Delta O_i$ and L have already been given, $N_i$ can be determined by substituting those values into Equation (8).

Further, there is a demand for producing, for example, a silicon wafer such that the warpage after performing a certain heat treatment (for example, LSA) is equal to or less than the target value; when $O_i$ and L of the silicon wafer to be prepared are desired to be determined before the above certain heat treatment, $N_i$ can be found from Equation (8) by assigning appropriate values to $\Delta O_i$ and L.

Next, in Step S2, the temperature distribution in the silicon wafer is determined by calculating heat transfer in the silicon wafer using an appropriate calculation method, for example, the finite element method, and the stress distribution a of the silicon wafer is determined from the determined temperature distribution. The determined stress distribution a can be resolved into the stress $\sigma_{RS}^{(n)}$ of each slip system.

The finite element method is widely used as a technique of heat transfer calculation for finding the temperature distribution of the material or calculation for finding the stress distribution. For example, commercially available software such as ABAQUS is available, and the above stress distribution a can be determined using such software.

Subsequently, the stress $\sigma_{RS}^{(n)}$ of each slip system determined in Step S3 and the initial dislocation density $N_i$ determined in Step S1 are substituted into the right-hand side of Equation (13), thereby finding the effective shear stress $\tau_{eff}^{(n)}$ of each slip system. The initial dislocation density $N_i$ is divided by 12 and assigned to the 12 slip systems.

Subsequently, in Step S4, the effective shear stress $\tau_{eff}^{(n)}$ of each slip system determined in Step S3 and the initial dislocation density $N_i$ determined in Step S1 are substituted into the right-hand side of Equation (12). The initial dislocation density $N_i$ is divided by 12 and assigned to the 12 slip systems. Thus, the rate of change (increase rate) $dN_m^{(n)}/dt$ in the mobile dislocation density $N_m^{(n)}$ of each slip system can be determined.

Further, in Step S5, the effective shear stress $\tau_{eff}^{(n)}$ of each slip system determined in Step S3 and the initial dislocation density $N_i$ determined in Step S1, the temperature $T_i$ at the start of heat treatment as the temperature T are substituted into Equation (10). The initial dislocation density $N_i$ is divided by 12 and assigned to the 12 slip systems. Thus, $f^{(n)}$ of each slip system can be determined. Further, $P_{ij}^{(n)}$ of each slip system can be determined by substituting the stress $\sigma_{RS}^{(n)}$ of each slip system found in Step S2 into the right-hand side of Equation (11).

The thus obtained $f^{(n)}$ and $P_{ij}^{(n)}$ of each slip system are substituted into the right-hand side of Equation (9), and $f^{(n)} \times P_{ij}^{(n)}$ of the 12 slip systems are summed, thus the rate of change (increase rate) in the plastic strain $\varepsilon$ can be found.

Thus, the rate of change (increase rate) $d\varepsilon_{ij}^{P}/dt$ in the plastic strain $\varepsilon$ at a time $t=0$ is determined. When the strain of the silicon wafer at the time $t=0$ is assumed to be zero, the strain $\varepsilon$ ($t=\Delta t$) after a micro time of $\Delta t$ s is expressed by Equation (14) below.

$$\varepsilon(t=\Delta t) = \varepsilon(t=0) + \left(\frac{d\varepsilon_{ij}^{P}}{dt}\right) \times \Delta t = \left(\frac{d\varepsilon_{ij}^{P}}{dt}\right) \times \Delta t \tag{14}$$

Further, the rate of change (increase rate) $N_m^{(n)}/dt$ of the mobile dislocation density $N_m^{(n)}$ of each slip system at the time t is also determined, and the mobile dislocation density $N_m^{(n)}$ ($t=\Delta t$) of each slip system after a micro time of $\Delta t$ s ($t=\Delta t$) is expressed by Equation (15) below.

$$N_m^{(n)}(t=\Delta t) = N_i^{(n)} + \left(\frac{dN_m^{(n)}}{dt}\right) \times \Delta t, \tag{15}$$

where $N_i^{(n)}$ is the initial dislocation density $N_i$ found in Step S1 and divided by 12 and assigned to the 12 slip systems, that is, $N_i/12$.

The calculations of Step S2 to Step S5 are performed based on the mobile dislocation density $N_m^{(n)}$ ($t=\Delta t$) at the time $t=\Delta t$ found as described above. The temperature T in Equation (10) and Equation (12) is changed to a value in accordance with an increase in the time $\Delta t$ to perform calculation. Thus, also for $t=\Delta t$, the rate of change (increase rate) $d\varepsilon/dt$ in the plastic strain $\varepsilon$ and the rate of change (increase rate) $N_m^{(n)}/dt$ in the mobile dislocation density $N_m$ of each slip system can be found. Subsequently, the strain $\varepsilon$ ($t=2\Delta t$) at $t=2\Delta t$ and the mobile dislocation density $N_m^{(n)}$ of each slip system can be obtained.

When the procedure of Step S2 to Step S5 is repeated with the time t being increased a micro time of $\Delta t$ as described above, the mobile dislocation density $N_m$, the stress $\sigma$, and the time evolution of the strain $\varepsilon$ can be calculated. The magnitude of plastic deformation of the silicon wafer after heat treatment can be obtained as a strain $\varepsilon$ ($t=t_f$) at the end of heat treatment ($t=t_f$) by summing the increment $\Delta\varepsilon$ of the strain $\varepsilon$ found by the calculation at each time t from the start of heat treatment to the end of heat treatment. Thus, the magnitude of plastic deformation, that is, the warpage caused when the silicon wafer is subjected to heat treatment can be predicted.

Note that the Peierls potential Q of silicon in Equations (10) and (12) means the energy barrier for linear dislocations moving in a perfect crystal. The lower the Peierls potential Q is, the lower the energy required for the movement of dislocations, thus the movement of dislocations is facilitated, and the velocity of the movement is higher. The velocity of movement v is given by the following equation.

$$v = v_0 \tau \exp\left(\frac{-Q}{kT}\right), \tag{16}$$

where $v_0$ is a constant, $\tau$ is the stress applied to the crystal.

For the sake of convenience, 2.2 eV that is typically used as the Peierls potential of silicon can be used as the value of Q above. This value is a value found with respect to silicon having sufficiently low impurity concentration. However, in practice, the velocity of the movement of dislocations v depends on impurities such as dopants added to control the conductivity type or the resistivity, and the value of the Peierls potential Q also depends on the impurities (for example, see K. Sumino, Philosophical Magazine A, Vol. 47, No. 4, 599 (1983)).

With this in mind, a Peierls potential of silicon determined in consideration of impurities is preferably used as the Peierls potential Q depending on the type, concentration, etc. of the impurities added to the silicon wafer. Thus, the warpage of the silicon wafer after heat treatment can be determined in consideration of the effect of impurities.

Specifically, it is known that when red phosphorus (P) is added as an impurity at high concentration, the velocity of the movement of dislocations is increased, and the value of Q is 1.7 eV in the above document by Sumino. Further, it is known that even if boron (B) is added as an impurity at high concentration, the velocity of the movement of dislocations does not significantly change. Accordingly, 2.2 eV can be used as the value of Q.

(Method of Producing Silicon Wafer)

A method of producing a silicon wafer will now be described. Warpage caused when a silicon wafer is subjected to heat treatment can be predicted by a method of predicting warpage of a silicon wafer, according to this disclosure, as described above. Using this, a silicon wafer can be produced such that the warpage after performing a certain heat treatment (for example, LSA) is equal to or less than a target value.

Specifically, when a silicon wafer is be produced such that the warpage after performing a certain heat treatment (for example, LSA) is equal to or less than the target warpage, first, using $\Delta O_i$ and L as parameters, $\Delta O_i$ and L with which warpage of the silicon wafer after the heat treatment is equal to or less than a target warpage are determined by the above method according to this disclosure. Specifically, the initial dislocation density $N_i$ is calculated with respect to $\Delta O_i$ and L, and using the obtained initial dislocation density $N_i$, the warpage of the silicon wafer having been subjected to the certain heat treatment is determined by the method according to this disclosure. When the warpage found exceeds the target warpage, $\Delta O_i$ and L are changed to calculate $N_i$, thereby recalculating the warpage. This procedure is performed until the warpage found becomes equal to or less than the target warpage.

Next, after $\Delta O_i$ and L yielding the warpage equal to or less than the target warpage are obtained, the conditions for growing a silicon single crystal are determined so that $\Delta O_i$ and L of the silicon wafer at the start of the above certain heat treatment become $\Delta O_i$ and L yielding the warpage obtained above equal to or less than the target warpage by a heat treatment in a step before the above certain heat treatment, for example, a field oxide film formation step in the device formation process. Further, the silicon single crystal is grown under the determined growth conditions, and the obtained silicon single crystal is worked into silicon wafers. Thus, when the produced silicon wafer is subjected to the above certain heat treatment, the warpage of the silicon wafer having been subjected to the heat treatment can be made equal to or less than the target warpage.

EXAMPLES

Examples will now be described; however, this disclosure is not limited to the Examples.

Experimental Examples 1 to 3

Experiments were performed for the purpose of verifying the validity of the model according to this disclosure. First, heat treatment for forming bulk micro defects (BMDs) that are oxygen precipitates in a silicon wafer (BMD heat treatment) was performed. Specifically, a 200 mm boron doped p-type CZ wafer having an initial oxygen concentration $O_i$ of approximately $1.2 \times 10^{18}$ cm$^{-3}$ was subjected to heat treatment at 650° C. (24 h)+850° C. (4 h)+1000° C. (12 h).

Next, heat treatment actually causing plastic deformation due to slip dislocations was performed. Specifically, the wafer was loaded at a rate of 100 mm/min into a vertical heat treatment furnace at 750° C., heated at a constant rate up to 1150° C., and maintained for 30 min, followed by cooling at a rate of 2° C./min down to 750° C., and was then removed at a rate of 100 mm/min from the furnace. Here, the heating rate from 750° C. to 1150° C. was 5° C./min (Experimental Example 1), 10° C./min (Experimental Example 2), and 15° C./min (Experimental Example 3). The warpages after the heat treatment are given in Table 1.

while the warpage was 82 μm in Experimental Example 3, the warpage was 92 μm in Example 3. These results demonstrate that the warpage of the wafers caused by the actual heat treatments were predicted with high accuracy by the method of predicting warpage of a silicon wafer, according to this disclosure.

Experimental Example 4

As with Experimental Example 3, the warpage of a silicon wafer was measured. The silicon wafer used however was an n-type CZ wafer heavily doped with red phosphorus (P). All the other conditions were the same as those in Experimental Example 3. The warpages found is given in Table 1.

Example 4

As with Example 3, the warpage of a silicon wafer was calculated. The silicon wafer envisaged was an n-type CZ wafer heavily doped with red phosphorus (P) in which the Peierls potential Q was 1.7 eV. All the other conditions were the same as those in Example 3. The warpages found is given in Table 1.

Comparison Between Experimental Example 4 and Example 4

As given in Table 1, in Experimental Example 4 using a wafer heavily doped with red phosphorus, the warpage was

TABLE 1

| Silicon wafer | Heating rate (° C./min) | Cooling rate (° C./min) | Peierls potential Q (eV) | Warpage (μm) | |
|---|---|---|---|---|---|
| | | | | Experimental Example | Example |
| Boron doped p-type | 5 | 2 | 2.2 | 0 (Experimental Example 1) | 0 (Example 1) |
| Boron doped p-type | 10 | 2 | 2.2 | 23 (Experimental Example 2) | 28 (Example 2) |
| Boron doped p-type | 15 | 2 | 2.2 | 82 (Experimental Example 3) | 90 (Example 3) |
| Red phosphorus heavily doped n-type | 15 | 2 | 1.7 | 121 (Experimental Example 4) | 128 (Example 4) |

Examples 1 to 3

A vertical heat treatment furnace was modeled in order to calculate the temperature distribution of silicon wafers simulating the furnace environments of Experimental Examples 1 to 3 above, and simulations were performed using the finite element method under the same conditions as in Examples. Specifically, in order to reflect temperature changes that the silicon wafers would undergo when loaded into the furnace, heat transfer calculation using a heat transfer model of radiation and stress calculation using the plastic deformation model in which the Peierls potential Q was 2.2 eV were performed thereby calculating the warpage of each silicon wafer. Here, the heating rate from 750° C. to 1150° C. was 5° C./min in Example 1, 10° C./min in Example 2, and 15° C./min in Example 3. The warpages found are given in Table 1.

Comparisons Between Experimental Examples 1-3 and Examples 1-3

As given in Table 1, when the heating rate was 5° C./min, while the warpage was 0 μm in Experimental Example 1, the warpage was also 0 μm in Example 1. Further, when the heating rate was 10° C./min, while the warpage was 23 μm in Experimental Example 2, the warpage was 28 μm in Example 2. Further, when the heating rate was 15° C./min, 121 μm that was larger than that in Experimental Example 3. On the other hand, in Example 3 using a Peierls potential (2.2 eV) determined without considering the effect of heavy doping with red phosphorus, the warpage was 90 μm. By contrast, in Example 4 using a Peierls potential (1.7 eV) determined in consideration of heavy doping with red phosphorus, the warpage was 128 μm, and the warpage in Experimental Example 4 was found to be predicted with high accuracy. The warpage in Example 3 was larger than the warpage in Example 4, since in Example 4, the Peierls potential was 1.7 eV that was lower than that of a p-type wafer, thus the movement of dislocations was facilitated. As described above, the warpage of a wafer can be more accurately predicted by using a Peierls potential determined in consideration of impurities depending on the impurity element to be added.

INDUSTRIAL APPLICABILITY

According to this disclosure, the warpage caused when a silicon wafer is subjected to heat treatment is predicted in consideration of the effect of oxygen.

The invention claimed is:
1. A method of predicting warpage caused when a silicon wafer is subjected to heat treatment, comprising:
   determining a mobile dislocation density, a stress, and a time evolution of strain of the silicon wafer being subjected to heat treatment from a rate of change in the strain and a rate of change in the mobile dislocation density; and determining a magnitude of plastic deformation of the silicon wafer as a warpage based on the determined time evolution of the strain, wherein a mobile dislocation density $N_i$ at the start of the heat treatment is given as:

$$N_i = A \times (\Delta O_i \times L - L_o)^{2.5} \quad (1),$$

where A and $L_0$: constants, $\Delta O_i$: a concentration of oxygen used by oxygen precipitates in the silicon wafer at the start of the heat treatment, L: a mean size of the oxygen precipitates in the silicon wafer at the start of the heat treatment.

2. The method of predicting warpage of a silicon wafer, according to claim 1, wherein the rate of change $d\varepsilon/dt$ in the strain $\varepsilon$ is given as:

$$\frac{d\varepsilon_{ij}^p}{dt} = \sum_{n=1}^{12} f^{(n)} p_{ij}^{(n)}, \quad (2)$$

where $$f^{(n)} = bk_0 N_m^{(n)} (\tau_{eff}^{(n)})^p \exp\left(\frac{-Q}{kT}\right), \quad (3)$$

$$P_{ij}^{(n)} = \frac{1}{2}\left(\frac{\sigma_{RS}^{(n)}}{|\sigma_{RS}^{(n)}|}\right)(v_i^{(n)} b_j^{(n)} + v_j^{(n)} b_i^{(n)}), \quad (4)$$

$$\tau_{eff}^{(n)} = |\sigma_{RS}^{(n)}| - D\sqrt{N_m^{(n)}} - \tau_d, \quad (5)$$

and b: a magnitude of a Burgers vector, $k_0$ and p: material constants, $N_m$: the mobile dislocation density, $\tau_{eff}$: an effective shear stress, Q: a Peierls potential of silicon, k: the Boltzmann constant, T: a temperature, $\sigma_{RS}$: the stress, $v_i$: a unit vector in the normal direction of a slip plane, a unit vector parallel with a slip direction, D: a strain hardening factor, and $\tau_d$: a drag stress.

3. The method of predicting warpage of a silicon wafer, according to claim 2, wherein as the Peierls potential Q of silicon, a Peierls potential of silicon, determined in consideration of the effect of impurities is used.

4. The method of predicting warpage of a silicon wafer, according to claim 3, wherein the stress is determined by the finite element method.

5. A method of producing a silicon wafer, comprising:
using $\Delta O_i$ and L as parameters, determining $\Delta O_i$ and L with which warpage of the silicon wafer after the heat treatment is equal to or less than a target warpage, by the method according to claim 3;

determining conditions for growing a silicon single crystal such that $\Delta O_i$ and L of the silicon wafer at the start of the heat treatment become $\Delta O_i$ and L with which the warpage of the silicon wafer after the heat treatment is equal to or less than the target warpage, thereby growing the silicon single crystal; and obtaining silicon wafers by working the resultant silicon single crystal.

6. The method of predicting warpage of a silicon wafer, according to claim 2, wherein the rate of change $dN_m^{(n)}/dt$ in the mobile dislocation density $N_m$ is given as:

$$\frac{dN_m^{(n)}}{dt} = Kk_0 N_m^{(n)}\left(\exp\left(\frac{-Q}{kT}\right)\right)(\tau_{eff}^{(n)})^{p+\lambda}, \quad (6)$$

where $$\tau_{eff}^{(n)} = |\sigma_{RS}^{(n)}| - D\sqrt{N_m^{(n)}} - \tau_d, \quad (7)$$

and

K: a constant, $k_0$, p, and $\lambda$: material constants, Q: the Peierls potential of silicon, k: the Boltzmann constant, T: the temperature, $\tau_{eff}$: the effective shear stress, $\sigma_{RS}$: the stress, D: the strain hardening factor, and $\tau_d$: the drag stress.

7. The method of predicting warpage of a silicon wafer, according to claim 2, wherein the stress is determined by the finite element method.

8. A method of producing a silicon wafer, comprising:
using $\Delta O_i$ and L as parameters, determining $\Delta O_i$ and L with which warpage of the silicon wafer after the heat treatment is equal to or less than a target warpage, by the method according to claim 2;

determining conditions for growing a silicon single crystal such that $\Delta O_i$ and L of the silicon wafer at the start of the heat treatment become $\Delta O_i$ and L with which the warpage of the silicon wafer after the heat treatment is equal to or less than the target warpage, thereby growing the silicon single crystal; and obtaining silicon wafers by working the resultant silicon single crystal.

9. The method of predicting warpage of a silicon wafer, according to claim 1, wherein the rate of change $dN_m^{(n)}/dt$ in the mobile dislocation density $N_m$ is given as:

$$\frac{dN_m^{(n)}}{dt} = Kk_0 N_m^{(n)}\left(\exp\left(\frac{-Q}{kT}\right)\right)(\tau_{eff}^{(n)})^{p+\lambda}, \quad (6)$$

where $$\tau_{eff}^{(n)} = |\sigma_{RS}^{(n)}| - D\sqrt{N_m^{(n)}} - \tau_d, \quad (7)$$

and

K: a constant, $k_0$, p, and $\lambda$: material constants, Q: the Peierls potential of silicon, k: the Boltzmann constant, T: the temperature, $\tau_{eff}$: the effective shear stress, $\sigma_{RS}$: the stress, D: the strain hardening factor, and $\tau_d$: the drag stress.

10. The method of predicting warpage of a silicon wafer, according to claim 9, wherein as the Peierls potential Q of silicon, a Peierls potential of silicon, determined in consideration of the effect of impurities is used.

11. The method of predicting warpage of a silicon wafer, according to claim 9, wherein the stress is determined by the finite element method.

12. A method of producing a silicon wafer, comprising:
using $\Delta O_i$ and L as parameters, determining $\Delta O_i$ and L with which warpage of the silicon wafer after the heat treatment is equal to or less than a target warpage, by the method according to claim 9;

determining conditions for growing a silicon single crystal such that $\Delta O_i$ and L of the silicon wafer at the start of the heat treatment become $\Delta O_i$ and L with which the warpage of the silicon wafer after the heat treatment is equal to or less than the target warpage, thereby growing the silicon single crystal; and obtaining silicon wafers by working the resultant silicon single crystal.

13. The method of predicting warpage of a silicon wafer, according to claim 1, wherein the stress is determined by the finite element method.

14. A method of producing a silicon wafer, comprising:

using $\Delta O_i$ and L as parameters, determining $\Delta O_i$ and L with which warpage of the silicon wafer after the heat treatment is equal to or less than a target warpage, by the method according to claim 13;

determining conditions for growing a silicon single crystal such that $\Delta O_i$ and L of the silicon wafer at the start of the heat treatment become $\Delta O_i$ and L with which the warpage of the silicon wafer after the heat treatment is equal to or less than the target warpage, thereby growing the silicon single crystal; and obtaining silicon wafers by working the resultant silicon single crystal.

15. A method of producing a silicon wafer, comprising:

using $\Delta O_i$ and L as parameters, determining $\Delta O_i$ and L with which warpage of the silicon wafer after the heat treatment is equal to or less than a target warpage, by the method according to claim 1;

determining conditions for growing a silicon single crystal such that $\Delta O_i$ and L of the silicon wafer at the start of the heat treatment become $\Delta O_i$ and L with which the warpage of the silicon wafer after the heat treatment is equal to or less than the target warpage, thereby growing the silicon single crystal; and obtaining silicon wafers by working the resultant silicon single crystal.

* * * * *

UNITED STATES PATENT AND TRADEMARK OFFICE
CERTIFICATE OF CORRECTION

PATENT NO. : 11,094,600 B2
APPLICATION NO. : 16/970063
DATED : August 17, 2021
INVENTOR(S) : Ko et al.

Page 1 of 1

It is certified that error appears in the above-identified patent and that said Letters Patent is hereby corrected as shown below:

In the Claims

Column 11, Line 41 (Claim 2, Line 15), please change "plane, a" to -- plane, bi: a --.

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*